(12) United States Patent
Ozeki et al.

(10) Patent No.: US 11,355,152 B2
(45) Date of Patent: Jun. 7, 2022

(54) DISK DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kenichiro Ozeki, Kanagawa (JP); Yu Chen, Kanagawa (JP); Koichiro Miyamoto, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/195,181

(22) Filed: Mar. 8, 2021

(65) Prior Publication Data

US 2022/0084555 A1 Mar. 17, 2022

(30) Foreign Application Priority Data

Sep. 17, 2020 (JP) .............................. JP2020-156422

(51) Int. Cl.
*G11B 5/48* (2006.01)
*G11B 21/08* (2006.01)
*G11B 5/012* (2006.01)
*H05K 1/02* (2006.01)

(52) U.S. Cl.
CPC .............. *G11B 21/08* (2013.01); *G11B 5/012* (2013.01); *H05K 1/028* (2013.01)

(58) Field of Classification Search
CPC .. G11B 5/00; G11B 5/09; G11B 5/012; G11B 5/48; G11B 20/10009; G11B 5/54; G11B 5/486; G11B 27/36
USPC ......................... 360/75, 97.01, 97.02, 244.1
See application file for complete search history.

(56) References Cited

U.S. PATENT DOCUMENTS

| 6,992,850 | B2 | 1/2006 | Nishiyama | |
| 6,992,864 | B2* | 1/2006 | Kaneko | G11B 5/4846 360/264.2 |
| 2005/0190489 | A1* | 9/2005 | Izumi | G11B 5/4846 360/97.19 |
| 2009/0034128 | A1 | 2/2009 | Sharma et al. | |
| 2011/0096438 | A1 | 4/2011 | Takada et al. | |
| 2017/0148481 | A1* | 5/2017 | Yamasaki | G11B 5/012 |

* cited by examiner

*Primary Examiner* — Nabil Z Hindi
(74) *Attorney, Agent, or Firm* — Kim & Stewart LLP

(57) ABSTRACT

According to one embodiment, a disk device includes a recording medium, a suspension, a magnetic head, an actuator, a circuit board, an FPC, a preamplifier, and an actuator driver. The magnetic head and the actuator are mounted on the suspension. The circuit board includes a control circuit. The FPC is connected to the suspension and the circuit board. The preamplifier is mounted on the FPC, outputs a write signal, to the magnetic head, corresponding to information to be written to the recording medium by the magnetic head, and receives, from the magnetic head, a read signal corresponding to information read from the recording medium by the magnetic head. The actuator driver is mounted apart from the preamplifier on the FPC, the actuator driver that outputs a drive signal for driving the actuator to the actuator.

10 Claims, 11 Drawing Sheets

DISK DEVICE

CROSS-REFERENCE TO RELATED APPLICATIONS

This application is based upon and claims the benefit of priority from Japanese Patent Application No. 2020-156422, filed on Sep. 17, 2020 the entire contents of which are incorporated herein by reference.

FIELD

Embodiments described herein relate generally to a disk device.

BACKGROUND

A disk device such as a hard disk drive includes a magnetic head mounted on a suspension to read and write information from and to a recording medium. The disk device moves the magnetic head to a target position, for example, by rotating an arm to which the suspension is attached. The disk device further includes an actuator on the suspension to be able to move the magnetic head to the target position.

The disk device includes a driver that applies a high-voltage drive signal to the actuator to drive the actuator. This causes higher impedance of the wiring between the driver and the actuator, which may result in noise propagation between the wiring and another wiring.

DETAILED DESCRIPTION

According to one embodiment, a disk device includes a recording medium of a disk form, a suspension, a magnetic head, an actuator, a circuit board, a flexible printed circuit board, a preamplifier, and an actuator driver. The magnetic head is mounted on the suspension and is configured to read and write information from and to the recording medium. The actuator is mounted on the suspension to move the magnetic head. The circuit board includes a control circuit that controls the magnetic head and the actuator. The flexible printed circuit board includes a first connection connected to the suspension and a second connection connected to the circuit board. The preamplifier is mounted on the flexible printed circuit board, the preamplifier that outputs, to the magnetic head, a write signal corresponding to information to be written to the recording medium by the magnetic head, and receives, from the magnetic head, a read signal corresponding to information read from the recording medium by the magnetic head. The actuator driver is mounted apart from the preamplifier on the flexible printed circuit board, the actuator driver that outputs a drive signal for driving the actuator to the actuator.

First Embodiment

Hereinafter, a first embodiment will be described with reference to FIGS. 1 to 5. constituent elements according to embodiments and descriptions of the elements are described in a plurality of expressions in some cases. The constituent elements and the descriptions thereof are merely examples and are not limited by the expressions in the present specification. The constituent elements can also be identified by names different from those in the present specification. In addition, the constituent elements can also be described by expressions different from those in the present specification.

Figure 1:
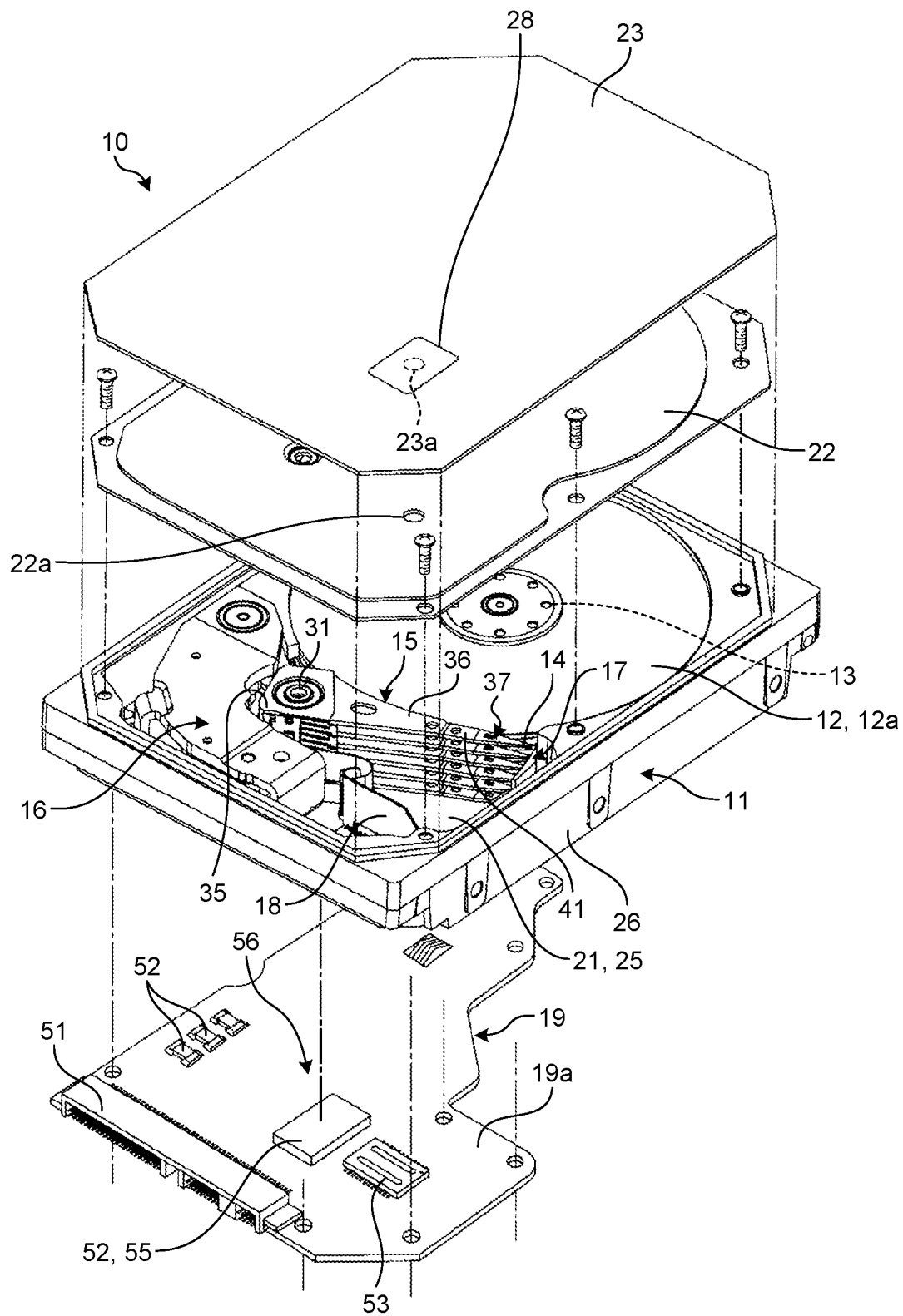
FIG. 1 is an exemplary perspective view illustrating a hard disk drive according to a first embodiment.

FIG. 1 is an exemplary perspective view illustrating a hard disk drive (HDD) 10 according to the first embodiment. The HDD 10 is an example of a disk device, and can also be referred to as an electronic device, a storage device, an external storage device, or a magnetic disk device.

The HDD 10 includes a housing 11, a plurality of magnetic disks 12, a spindle motor 13, a plurality of magnetic heads 14, an actuator assembly 15, a voice coil motor (VCM) 16, a ramp load mechanism 17, a flexible printed circuit board (FPC) 18, and a printed circuit board (PCB) 19. The magnetic disk 12 is an example of a recording medium. The PCB 19 is an example of a circuit board.

The housing 11 includes a base 21, an inner cover 22, and an outer cover 23. The base 21 is a bottomed container and has a bottom wall 25 and a sidewall 26. The bottom wall 25 has a substantially rectangular or quadrangular plate shape. The sidewall 26 protrudes from an edge of the bottom wall 25. The bottom wall 25 and the sidewall 26 are formed of a metal material such as an aluminum alloy in a united manner.

The inner cover 22 and the outer cover 23 are made of a metal material as, for example, an aluminum alloy. The inner cover 22 is attached to an end of the sidewall 26 with, for example, screws. The outer cover 23 covers the inner cover 22 and is airtightly fixed to the end of the sidewall 26 by welding, for example.

The inside of the housing 11 is sealed. The magnetic disks 12, the spindle motor 13, the magnetic heads 14, the actuator assembly 15, the VCM 16, the ramp load mechanism 17, and the FPC 18 are arranged inside the housing 11.

The inner cover 22 is provided with a vent 22a. The outer cover 23 is provided with a vent 23a. After parts are attached to the inside of the base 21 and the inner cover 22 and the outer cover 23 are attached to the base 21, air is evacuated from inside the housing 11 through the vents 22a and 23a. Further, the inside of the housing 11 is filled with a gas different from air.

Examples of the gas that fill the inside of the housing 11 include a low-density gas having a density lower than air and an inert gas having a low reactivity. For example, the inside of the housing 11 is filled with helium. The housing 11 may be filled with other fluids inside. In addition, the inside of the housing 11 may be maintained in a vacuum, at a low pressure close to the vacuum, or at a negative pressure lower than the atmospheric pressure.

The vent 23a of the outer cover 23 is closed by a seal 28. The seal 28 airtightly seals the vent 23a to prevent the fluid filling from leaking from the inside of the housing 11 through the vent 23a.

Each magnetic disk 12 includes, for example, a magnetic recording layer formed on a surface 12a such as an upper surface and a lower surface. A diameter of the magnetic disk 12 is, for example, set to 3.5 inches but is not limited to this example.

The spindle motor 13 supports and rotates the magnetic disks 12 stacked at intervals in a direction in which the surface 12a faces. The magnetic disks 12 are held in a hub of the spindle motor 13 with, for example, a clamp spring.

Each magnetic head 14 records and reproduces information on and from the recording layer of the corresponding magnetic disk 12. In other words, the magnetic head 14 reads and writes information from and to the corresponding magnetic disk 12. The magnetic heads 14 are mounted on the actuator assembly 15.

The actuator assembly 15 is rotatably supported by a support shaft 31 located apart from the magnetic disks 12. The VCM 16 rotates the actuator assembly 15 to a desired position. After the magnetic head 14 moves to the outermost circumference of the magnetic disk 12 along with the rotation of the actuator assembly 15 by the VCM 16, the ramp load mechanism 17 holds the magnetic head 14 at an unload position apart from the magnetic disk 12.

The actuator assembly 15 includes an actuator block 35, a plurality of arms 36, and a plurality of head suspension assemblies 37. The head suspension assemblies 37 are an example of a suspension and is referred to as the suspensions 37 hereinafter. Each suspension 37 can also be referred to as a head gimbal assembly (HGA).

The actuator block 35 is rotatably supported by the support shaft 31 via, for example, a bearing. The plurality of arms 36 protrudes from the actuator block 35 in a direction substantially orthogonal to the support shaft 31. The actuator assembly 15 may be divided such that the arms 36 may protrude from the corresponding actuator blocks 35.

The arms 36 are arranged at intervals in a direction in which the support shaft 31 extends. Each of the arms 36 has a plate shape insertable in-between the adjacent magnetic disks 12. The arms 36 extend substantially in parallel.

The actuator block 35 and the arms 36 are integrally formed of, for example, aluminum. Materials of the actuator block 35 and the arms 36 are not limited to this example.

The actuator block 35 has a protrusion projecting in the direction opposite to the arms 36, and a voice coil of the VCM 16 is set on the protrusion. The VCM 16 includes a pair of yokes, the voice coil placed between the yokes, and magnets included in the yokes.

As described above, the VCM 16 rotates the actuator assembly 15. In other words, the VCM 16 rotates or moves the actuator block 35, the arms 36, and the suspensions 37 together.

The suspensions 37 are attached to distal ends of the corresponding arms 36 and protrude from the arms 36. As a result, the suspensions 37 are arranged at intervals in the extending direction of the support shaft 31.

Figure 2:
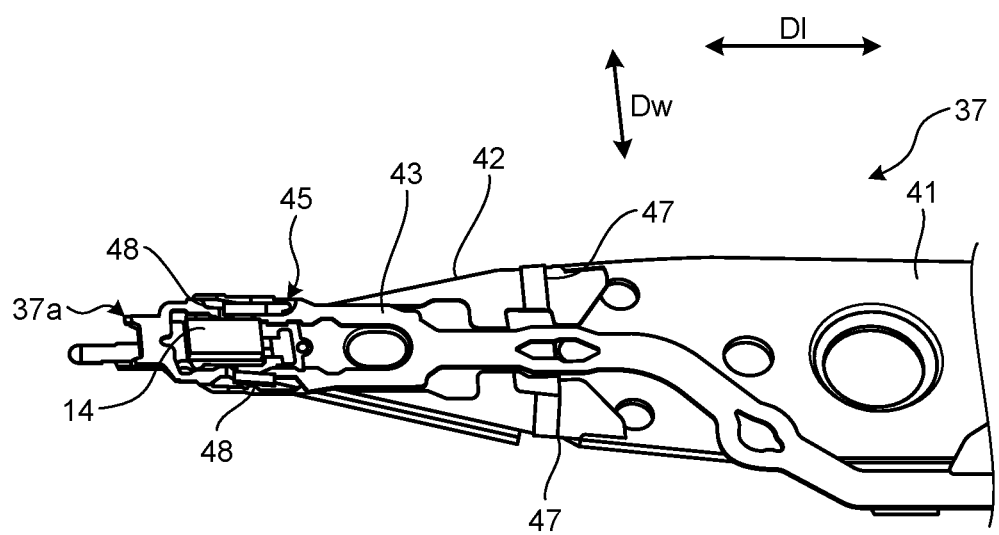
FIG. 2 is an exemplary perspective view illustrating a part of a suspension of the first embodiment.

FIG. 2 is an exemplary perspective view illustrating a part of the suspension 37 of the first embodiment. As illustrated in FIG. 2, each of the suspension 37 includes a base plate 41, a load beam 42, and a flexure 43. The magnetic head 14 is mounted on a distal end 37a of the suspension 37. The distal end 37a of the suspension 37 is opposite the end attached to the arm 36 in a direction (longitudinal direction) Dl in which the arm 36 and the suspension 37 extend.

The base plate 41 and the load beam 42 are made of, for example, stainless steel. Materials of the base plate 41 and the load beam 42 are not limited to this example. The base plate 41 has a plate shape and is attached to the distal end of the arm 36. The load beam 42 has a plate shape thinner than the base plate 41. The load beam 42 is attached to a distal end of the base plate 41 and protrudes from the base plate 41.

The flexure 43 has an elongated strip shape. The shape of the flexure 43 is not limited to this example. The flexure 43 is a laminated plate including a metal plate (backing layer) such as stainless steel, an insulating layer formed on the metal plate, a conductive layer forming a plurality of wires (wiring patterns) on the insulating layer, and a protective layer (insulating layer) covering the conductive layer.

A displaceable gimbal (elastic support) 45 is located at one end of the flexure 43 above the load beam 42. The gimbal 45 is located at the distal end 37a of the suspension 37. The magnetic head 14 is mounted on the gimbal 45. The other end of the flexure 43 is connected to the FPC 18. As a result, the FPC 18 is electrically connected to the magnetic head 14 via the wiring of the flexure 43.

A first micro-actuator (MA) pair 47 and a second micro-actuator (MA) pair 48 are mounted on the suspension 37. The first MA pair 47 and the second MA pair 48 are examples of an actuator and an actuator element.

The first MA pair 47 and the second MA pair 48 are piezoelectric elements. The first MA pair 47 and the second MA pair 48 are bulk, bulk-layer, or thin-film piezo elements, for example. The first MA pair 47 and the second MA pair 48 are not limited to this example.

Each of the first MA pair 47 connects, for example, the base plate 41 and the load beam 42. In other words, one end of the first MA 47 is attached to the base plate 41 and the other end is attached to the load beam 42. The first MA 47 is not limited to this example. The first MA pair 47 are apart from each other in a direction (width direction) Dw orthogonal to the longitudinal direction Dl and along the surface 12a of the magnetic disk 12.

Along with individual expansion and contraction of the first MA pair 47, part, of the suspension 37, closer to the distal end 37a than the first MA pair 47 is elastically bent along the surface 12a of the magnetic disk 12. As a result, the first MA pair 47 moves the magnetic head 14 mounted on the distal end 37a of the suspension 37.

The second MA pair 48 is located near the distal end 37a of the suspension 37. In other words, each of the second MA pair 48 is mounted on the suspension 37 at a position closer to the magnetic head 14 than the first MA pair 47. For example, the second MA pair 48 is mounted on the gimbal 45. The second MA pair 48 is not limited to this example and may be mounted on the load beam 42, for example.

The second MA pair 48 are apart from each other in the width direction Dw. Along with individual expansion and contraction of the second MA pair 48, the distal end 37a of the suspension 37 is elastically bent along the surface 12a of the magnetic disk 12. As a result, the second MA pair 48 moves the magnetic head 14 mounted on the distal end 37a of the suspension 37.

As described above, the HDD 10 of the present embodiment adopts a triple stage actuator (TSA) system that moves the magnetic head 14 for position adjustment using the VCM 16, the first MA pair 47, and the second MA pair 48. The HDD 10 is not limited to this example, and the position of the magnetic head 14 may be adjusted by a dual stage actuator (DSA) system that moves the magnetic head 14 using the VCM 16 and the first MA pair 47.

The PCB 19 illustrated in FIG. 1 is, for example, a rigid (such as glass epoxy), multi-layer or build-up substrate. The PCB 19 is located outside the housing 11 and is attached to the outside of the bottom wall 25 of the base 21. The PCB 19 is attached to the bottom wall 25 with, for example, a plurality of screws.

The PCB 19 has a mounting surface 19a facing the bottom wall 25. For example, an interface (I/F) connector 51, a plurality of electronic components 52, and a relay connector 53 are mounted on the mounting surface 19a.

The I/F connector 51 is a connector conforming to an interface standard such as Serial ATA, and is connected to an I/F connector of a host computer. The HDD 10 receives power supply from the host computer through the I/F connector 51, and transmits and receives various types of data to and from the host computer.

The plurality of electronic components 52 includes, for example, a system-on-chip (SoC) 55. The plurality of electronic components 52 further includes, for example, a servo combo IC (SVC) that drives the spindle motor 13 and the VCM 16, various memories such as a RAM, a ROM, and a buffer memory, and other electronic components such as a coil and a capacitor.

The SoC 55 includes, for example, a read/write channel (RWC), a hard disk controller (HDC), and a processor. The RWC, the HDC, and the processor may be separate components.

The processor of the SoC 55 is, for example, a central processing unit (CPU). The processor controls the HDD 10 as a whole according to firmware pre-stored in the ROM, for example. For example, the processor loads the firmware from the ROM onto the RAM and performs control of the magnetic heads 14, the RWC, the HDC, and other parts according to the loaded firmware.

The PCB 19 is equipped with a control circuit 56 including the electronic components 52 including the SoC 55 and a conductor pattern such as the wiring formed on the PCB 19. The control circuit 56 controls the spindle motor 13, the magnetic heads 14, the VCM 16, the first MA pairs 47, and the second MA pairs 48. The control circuit 56 may control another circuit located in an element different from the PCB 19 to indirectly control the spindle motor 13, the magnetic heads 14, the VCM 16, the first MA pairs 47, and the second MA pairs 48.

The relay connector 53 is electrically connected to various components arranged inside the housing 11 through, for example, a connector located on the bottom wall 25. Thus, the PCB 19 is electrically connected to the spindle motor 13, the magnetic heads 14, the actuator assembly 15, the VCM 16, the FPC 18, the first MA pairs 47, and the second MA pairs 48 arranged inside the housing 11.

Figure 3:
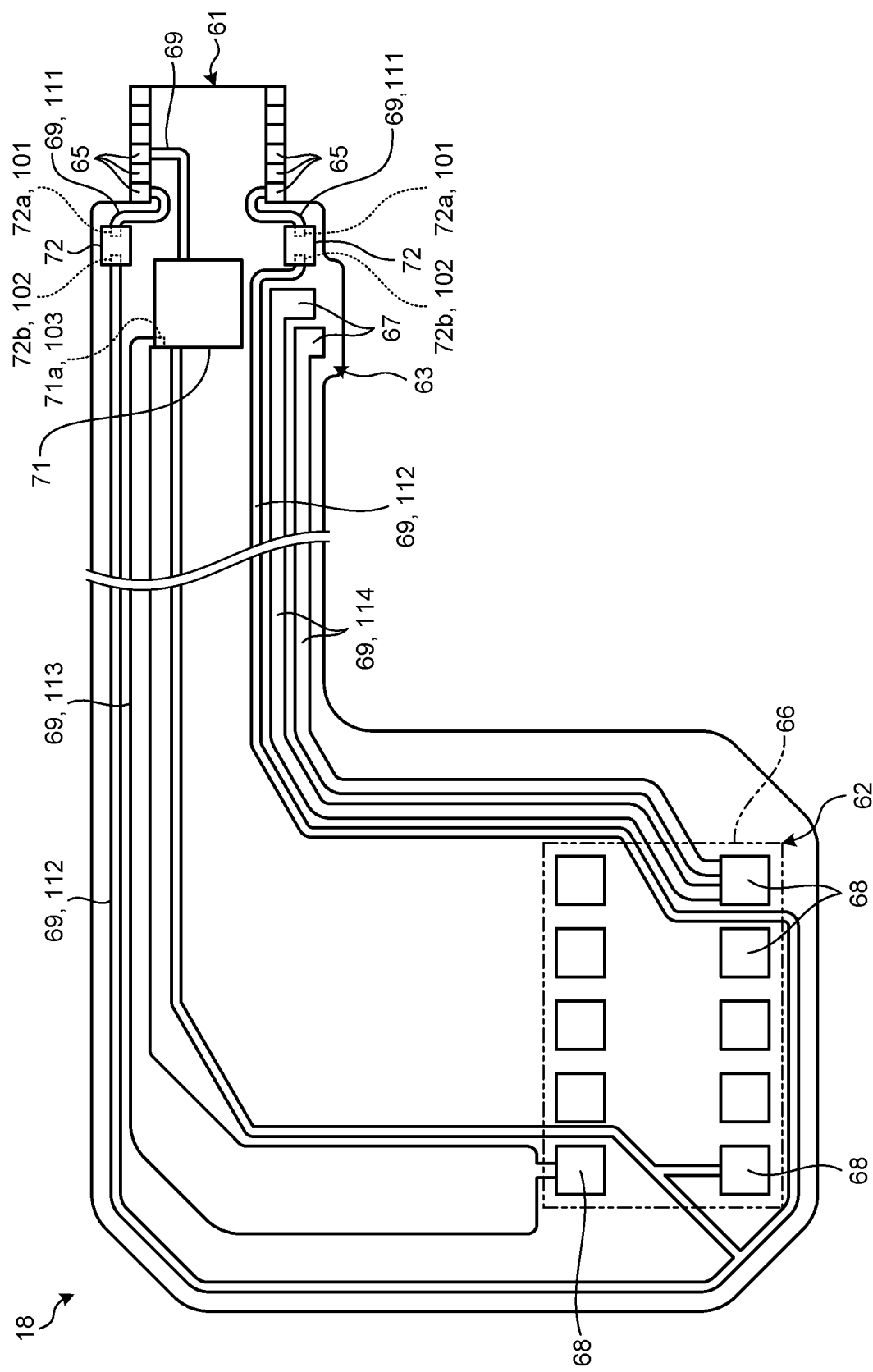
FIG. 3 is an exemplary plan view schematically illustrating a flexible printed circuit board of the first embodiment.

FIG. 3 is an exemplary plan view schematically illustrating the FPC 18 of the first embodiment. The FPC 18 includes, for example, an insulating layer made of an insulating material such as polyimide, a conductive layer formed on the insulating layer, and an insulating protective layer covering the conductive layer. As illustrated in FIG. 3, the FPC 18 has a substantially L-shape. The shape of the FPC 18 is not limited to this example. The FPC 18 includes a first connection 61, a second connection 62, and a third connection 63.

The first connection 61 is located, for example, at one end of the FPC 18 in the extending direction of the FPC 18. The first connection 61 is provided with a plurality of terminals 65. The terminals 65 are, for example, pads on the surface of the FPC 18. The terminals 65 are connected to a plurality of terminals of each flexure 43 with, for example, a conductive adhesive or solder. As a result, the first connection 61 is connected to the flexures 43 of the suspensions 37.

The second connection 62 is located, for example, at the other end of the FPC 18 in the extending direction of the FPC 18. The second connection 62 includes a connector 66 protruding from the surface of the FPC 18. The connector 66 is electrically connected to the relay connector 53 on the PCB 19 through, for example, a connector provided on the bottom wall 25 of the housing 11. As a result, the second connection 62 is connected to the PCB 19. The connector 66 may be directly connected to the relay connector 53 on the PCB 19.

The third connection 63 is located, for example, in the vicinity of the first connection 61. The third connection 63 is provided with a plurality of VCM terminals 67. The VCM terminals 67 are, for example, pads on the surface of the FPC 18. The VCM terminals 67 are connected to a plurality of terminals of the voice coil of the VCM 16 with, for example, a conductive adhesive or solder. As a result, the third connection 63 is connected to the VCM 16.

The connector 66 includes a plurality of pins 68 serving as terminals. The FPC 18 is electrically connected to the PCB 19 through the connection between the pins 68 and the terminals of the connector on the bottom wall 25.

The FPC 18 further includes a plurality of wires 69. The wires 69 are, for example, a wiring pattern formed on the conductive layer of the FPC 18. The wires 69 connect, for example, the pins 68 and the terminals 65 or the VCM terminals 67.

A preamplifier 71 and a plurality of MA drivers 72 are mounted on the FPC 18. The preamplifier 71 is also called a head amplifier. The MA drivers 72 are an example of an actuator driver, a driver element, and an electronic component. The preamplifier 71 and the MA drivers 72 are separately mounted on the FPC 18. That is, the preamplifier 71 and the MA drivers 72 are separate components.

Figure 4:
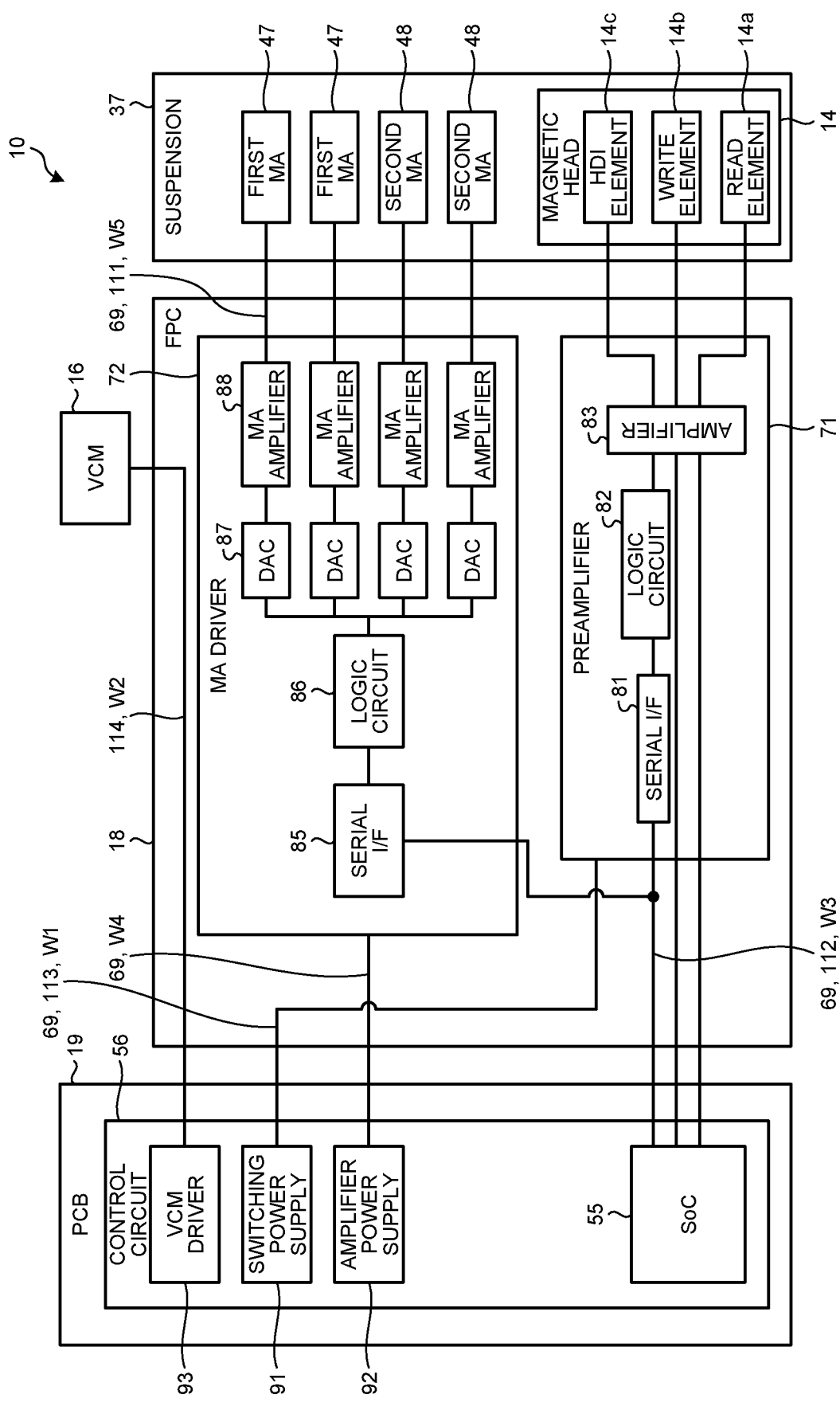
FIG. 4 is an exemplary block diagram schematically illustrating functions of the hard disk drive of the first embodiment.

FIG. 4 is an exemplary block diagram schematically illustrating functions of the HDD 10 of the first embodiment. As illustrated in FIG. 4, the preamplifier 71 includes a serial interface (I/F) 81, a logic circuit 82, and an amplifier 83. The preamplifier 71 may include other components and circuitry.

The preamplifier 71 is connected to the terminal 65 of FIG. 3 through at least one of the wires 69. Thus, the preamplifier 71 is electrically connected to the magnetic head 14 via the flexure 43 as illustrated in FIG. 4. The preamplifier 71 is electrically connected to, for example, a read element 14a, a write element 14b, and an HDI element 14c of the magnetic head 14.

The read element 14a reads information from the magnetic disk 12 to output a read signal. The write element 14b receives a write signal to write information to the magnetic disk 12 in accordance with the write signal. For example, the HDI element 14c generates heat in accordance with an input signal and adjusts the height of the magnetic head 14 floating from the surface 12a of the magnetic disk 12. In addition, the HDI element 14c outputs, for example, a collision detection signal for detecting a collision between the magnetic head 14 and the surface 12a of the magnetic disk 12, if it occurs.

The preamplifier 71 is connected to the pin 68 of the connector 66 of FIG. 3 through at least one of the wires 69. As a result, the preamplifier 71 is electrically connected to the control circuit 56 via the PCB 19 as illustrated in FIG. 4. The preamplifier 71 is electrically connected to, for example, the SoC 55 including the RWC.

The RWC is a signal processing circuit, and receives write data from the HDC of the SoC 55, encodes and converts the write data into a write signal, and outputs the write signal to the preamplifier 71. In addition, the RWC receives a read signal from the magnetic head 14, decodes and converts the read signal into read data, and outputs the read data to the HDC.

The preamplifier 71 uses the amplifier 83 to amplify a write signal output from the RWC of the SoC 55 and transmits the amplified write signal to the write element 14b of the magnetic head 14. The write element 14b writes information to the magnetic disk 12 in accordance with the write signal. In other words, the preamplifier 71 outputs, to the magnetic head 14, a write signal corresponding to information to be written to the magnetic disk 12 by the magnetic head 14.

The preamplifier 71 uses the amplifier 83 to amplify a read signal output from the read element 14a and transmits the amplified read signal to the RWC of the SoC 55. In other words, the preamplifier 71 receives, from the magnetic head 14, a read signal corresponding to information read from the magnetic disk 12 by the magnetic head 14.

The preamplifier 71 transmits and receives digital signals such as a serial signal to and from the SoC 55 of the control circuit 56 via the serial I/F 81. For example, the SoC 55 outputs a write power or current control signal, a control signal for the HDI element 14c, and a gain control signal for the amplifier 83 to the serial I/F 81. The digital signals are not limited to these examples. The logic circuit 82 processes these digital signals.

The preamplifier 71 also transmits and receives analog signals to and from the SoC 55. For example, the preamplifier 71 receives a write signal from the RWC of the SoC 55 and transmits a read signal to the RWC.

For example, the amplifier 83 receives and amplifies the read signal from the read element 14a and outputs the amplified read signal to the RWC of the SoC 55. In addition, the amplifier 83 receives and amplifies the write signal from the RWC and outputs the amplified write signal to the write element 14b. The amplifier 83 may amplify other signals.

Each MA driver 72 includes a serial interface (I/F) 85, a logic circuit 86, a plurality of digital-to-analog converters (DACs) 87, and a plurality of MA amplifiers 88. The MA amplifiers 88 are an example of an amplifier. The MA driver 72 may include other components and circuitry.

The MA driver 72 is connected to the terminal 65 in FIG. 3 through at least one of the wires 69. As a result, the MA drivers 72 are each electrically connected to the first MA pair 47 and the second MA pair 48 via the flexure 43 as illustrated in FIG. 4.

The MA driver 72 is connected to the pin 68 of the connector 66 in FIG. 3 through at least one of the wires 69. As a result, the MA driver 72 is electrically connected to the control circuit 56 via the PCB 19 as illustrated in FIG. 4. The MA driver 72 is electrically connected to, for example, the SoC 55.

The MA driver 72 transmits and receives a digital signal such as a serial signal to and from the SoC 55 of the control circuit 56 through the serial I/F 85. The serial I/F 85 transmits and receives various digital signals output by the SoC 55. For example, the SoC 55 outputs a serial signal to the serial I/F 85 to control the first MA 47 or the second MA 48. The digital signal is not limited to this example.

The logic circuit 86 processes various serial signals. For example, the logic circuit 86 outputs a serial signal received by the serial I/F 85 to one of the DACs 87 corresponding to the serial signal. The logic circuit 86 may perform other processing.

The DAC 87 receives and converts the serial signal from the logic circuit 82 into an analog drive signal for driving the corresponding first MA 47 or second MA 48. The DAC 87 outputs the analog drive signal to the corresponding MA amplifier 88.

The MA amplifiers 88 are electrically connected to the corresponding DACs 87 and the corresponding first MAs 47 or second MAs 48. Each MA amplifier 88 receives and amplifies the drive signal from the corresponding DAC 87 and outputs the amplified drive signal to the corresponding first MA 47 or second MA 48. That is, the MA driver 72 outputs the drive signals for driving the first MAs 47 or the second MAs 48 to the first MAs 47 or the second MAs 48.

The number of the MA amplifiers 88 is, for example, equal to the total number of the first MAs 47 and the second MAs 48, and is set to four in the present embodiment. The number of the DACs 87 is equal to, for example, the number of the MA amplifiers 88, and is set to four in the present embodiment. The number of the DACs 87 and the number of the MA amplifiers 88 are not limited to these examples.

In the case of using a differential signal, for example, the number of the DACs 87 can be a half of the number of the MA amplifiers 88. In addition, when the actuators (first MA pair 47 and second MA pair 48) are collectively controlled, the number of the DACs 87 can be one.

The control circuit 56 further includes a switching power supply 91, an amplifier power supply 92, and a VCM driver 93. The switching power supply 91, the amplifier power supply 92, and the VCM driver 93 are included in the SVC, for example. The switching power supply 91, the amplifier power supply 92, and the VCM driver 93 are not limited to this example.

The switching power supply 91 is, for example, a power supply circuit that supplies power of −3 V to the preamplifier 71. The amplifier power supply 92 is a power supply circuit that supplies power (+V, −V) to the MA amplifiers 88 of the MA driver 72. The VCM driver 93 outputs a drive signal for driving the VCM 16 to the VCM 16.

As illustrated in FIG. 3, the FPC 18 includes first driver terminals 101, second driver terminals 102, and a preamplifier terminal 103. The first driver terminals 101 are an example of a first terminal. The preamplifier terminal 103 is an example of a second terminal. The first driver terminals 101, the second driver terminals 102, and the preamplifier terminal 103 are, for example, pads on the surface of the FPC 18.

The first driver terminals 101 are connected to terminals 72a of the MA drivers 72 with, for example, a conductive adhesive or solder. The terminals 72a are connected to the MA amplifiers 88 of the MA drivers 72. Although FIG. 3 schematically illustrates one terminal 72a and one first driver terminal 101 for one MA driver 72, each MA driver 72 includes a plurality of terminals 72a corresponding to the plurality of MA amplifiers 88. Further, the FPC 18 includes a plurality of first driver terminals 101 corresponding to the plurality of terminals 72a.

Each second driver terminal 102 is connected to a terminal 72b of the MA driver 72 with, for example, a conductive adhesive or solder. The terminal 72b is connected to the serial I/F 85 of the MA driver 72.

The preamplifier terminal 103 is connected to a terminal 71a of the preamplifier 71 with, for example, a conductive adhesive or solder. The VCM terminals 67 are connected to a terminal of the VCM 16 with, for example, a conductive adhesive or solder.

The plurality of wires 69 includes a first driver wire 111, a second driver wire 112, a power supply wire 113, and two VCM wires 114. The first driver wire 111 is an example of a first wire and a fourth wire. The second driver wire 112 is an example of a fifth wire. The power supply wire 113 is an example of a second wire. The two VCM wires 114 are examples of a third wire.

The first driver wire 111 connects the first driver terminal 101 and at least one of the terminals 65 of the first connection 61. Thus, the first driver wire 111 connects the terminal 72a of the MA driver 72 and the terminal 65 of the first connection 61.

The second driver wire 112 connects the second driver terminal 102 and one of the pins 68 of the connector 66 of the second connection 62. That is, the second driver wire 112 connects the terminal 72b of the MA driver 72 and the pin 68 of the second connection 62.

The power supply wire 113 connects the preamplifier terminal 103 and one of the pins 68 of the connector 66 of the second connection 62. The switching power supply 91 supplies power to the preamplifier 71 connected to the preamplifier terminal 103 through the second connection 62 and the power supply wire 113. That is, the power supply wire 113 is for supplying power to the preamplifier 71.

The VCM wires 114 connect the two VCM terminals 67 of the third connection 63 and the pin 68 of the connector 66 of the second connection 62. The wires 69 include a wire that connects the preamplifier 71 and the terminal 65 of the first connection 61, and a wire that connects the preamplifier 71 and the pin 68 of the connector 66 of the second connection 62. FIG. 3 omits depicting part of the wires 69 for the sake of simpler explanation. For example, the wires 69 include a wire that connects the amplifier power supply 92 and the MA drivers 72 to supply power to the MA amplifiers 88, a wire that connects the RWC of the SoC 55 and the preamplifier 71 to transmit the read signal and the write signal, and other various wires.

The preamplifier 71 and the MA driver 72 are located in the vicinity of the first connection 61. Thus, the MA driver 72 is located closer to the first connection 61 than to the second connection 62. In other words, a distance between the MA driver 72 and the first connection 61 is shorter than a distance between the MA driver 72 and the second connection 62. That is, the first driver wire 111 is shorter in length than the second driver wire 112.

The MA driver 72 is located closer to the first connection 61 than the preamplifier 71. In other words, the distance between the MA driver 72 and the first connection 61 is shorter than a distance between the preamplifier 71 and the first connection 61. The MA driver 72 may be located farther from the first connection 61 than the preamplifier 71.

The first driver terminal 101 is located closer to the first connection 61 than the preamplifier terminal 103. Thus, the first driver wire 111 extends from the first driver terminal 101 not alongside the power supply wire 113 extending from the preamplifier terminal 103. In other words, the first driver wire 111 is not adjacent to the power supply wire 113.

The first driver terminal 101 is located closer to the first connection 61 than the VCM terminals 67 of the third connection 63. Thus, the first driver wire 111 extends from the first driver terminal 101 not alongside the VCM wires 114 extending from the VCM terminals 67. In other words, the first driver wire 111 is not adjacent to the VCM wires 114.

The first driver wire 111 transmits a drive signal with a voltage amplified by the MA amplifier 88. The drive signal is lower in current than in voltage, which increases an impedance of the first driver wire 111. Meanwhile, the second driver wire 112 transmits a digital signal such as a serial signal. That is, the second driver wire 112 has a lower impedance than the first driver wire 111.

In the present embodiment, the second driver wire 112 is branched to connect the preamplifier 71, the MA driver 72, and the second connection 62. Thus, the SoC 55, the serial I/F 81 of the preamplifier 71, and the serial I/F 85 of the MA driver 72 are electrically connected to one another as illustrated in FIG. 4.

Figure 5:
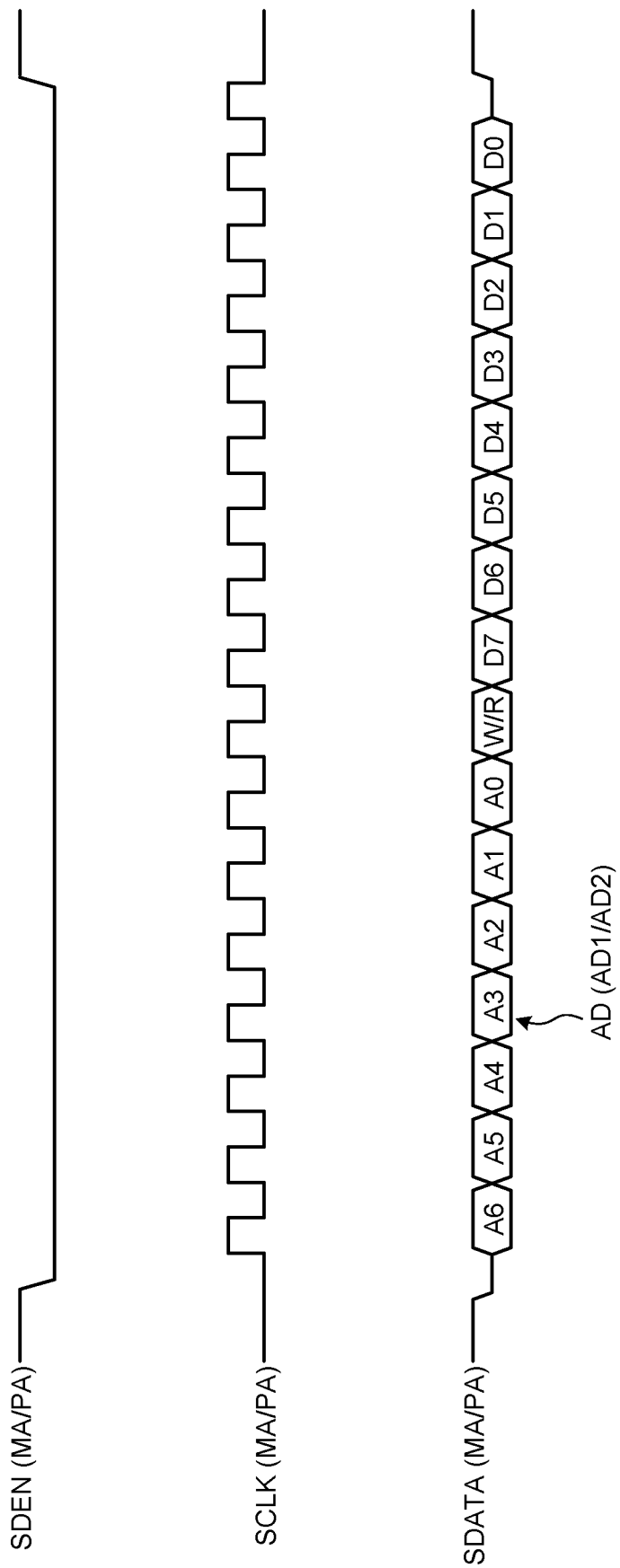
FIG. 5 is an exemplary timing chart illustrating an example of a serial signal output by a system-on-chip of the first embodiment.

FIG. 5 is an exemplary timing chart illustrating an example of a serial signal output by the SoC 55 of the first embodiment. The SoC 55 outputs common serial signals illustrated in FIG. 5 to the serial I/F 81 of the preamplifier 71 and the serial I/F 85 of the MA driver 72.

For example, the SoC 55, the serial I/F 81 of the preamplifier 71, and the serial I/F 85 of the MA driver 72 are connected in parallel through three wires. The SoC 55 outputs an enable signal SDEN, a clock signal SCLK, and a data signal SDATA to the serial I/F 81 of the preamplifier 71 and the serial I/F 85 of the MA driver 72. The serial signal is not limited to this example.

The data signal SDATA includes an address AD. The address AD is set to a first address AD1 for the preamplifier 71 or to a second address AD2 for the MA driver 72. In other words, the SoC 55 of the control circuit 56 outputs a digital signal including the first address AD1 or the second address AD2. The address AD is not limited to this example. In response to receipt of the data signal SDATA by the serial I/Fs 81 and 85, the logic circuits 82 and 86 operate according to the address AD.

The logic circuit 82 of the preamplifier 71 operates in accordance with the data signal SDATA including the first address AD1. For example, the logic circuit 82 outputs various control signals to the magnetic head 14 through the amplifier 83 in accordance with the data signal SDATA including the first address AD1. For example, the logic circuit 82 outputs a write power or current control signal or a control signal for the HDI element 14c to the magnetic head 14 through the amplifier 83. In addition, the logic circuit 82 controls a gain of the amplifier 83 in accordance with the gain control signal. When receiving a data signal SDATA including the second address AD2, however, the logic circuit 82 ignores the data signal SDATA.

The logic circuit 86 of the MA driver 72 outputs the data signal SDATA including the second address AD2 to the DAC 87 corresponding to the second address AD2. As a result, the DAC 87 converts a digital signal including the corresponding second address AD2 into an analog drive signal. When receiving the data signal SDATA including the first address AD1, however, the logic circuit 82 ignores the data signal SDATA.

As described above, the SoC 55 adds the first address AD1 to the data signal SDATA for causing the preamplifier 71 to output the control signal to the magnetic head 14. In addition, the SoC 55 adds the second address AD2 to the data signal SDATA for causing the MA driver 72 to output the drive signal. Thereby, irrespective of receipt of a common digital signal for the preamplifier 71 and the MA driver 72, the preamplifier 71 and the MA driver 72 can operate by the data signals SDATA including their corresponding addresses AD, preventing occurrence of communication interference.

As described above, the second driver wire 112 is branched. As illustrated in FIG. 3, the second driver wire 112, which transmits the serial signal to the preamplifier 71 and the MA drivers 72, branches on the FPC 18. This can decrease the number of the pins 68 in the connector 66 for transmitting the serial signal, as compared with individual wires or a wire branching on the PCB 19 for transmitting the serial signals to the preamplifier 71 and the MA drivers 72.

In addition, each MA driver 72 is connected in parallel to the first MAs 47 and the second MAs 48. As described above, the logic circuit 86 of the MA driver 72 changes a signal transmission destination in response to the second address AD2. That is, according to the MA driver 72, the number of wires connected to the serial I/F 85 of the MA driver 72 can be constant regardless of the number of actuators (first MAs 47 and second MAs 48) connected to the MA driver 72.

In the HDD 10 as above, the switching power supply 91 of FIG. 4 may generate noise. The noise occurring in the switching power supply 91 may propagate from a wire W1 connecting the switching power supply 91 and the preamplifier 71 to another wire. The wire W1 serves as an electric path including the power supply wire 113 and a wire on the PCB 19 connected to the power supply wire 113.

Wiring having a high impedance is likely to propagate noise to another wiring. For example, noise may propagate from the wire W1 to a wire W2 connecting the VCM driver 93 and the VCM 16. The wire W2 serves as an electric path including the VCM wires 114 and a wire on the PCB 19 connected to the VCM wires 114.

In contrast, wiring for transmitting a digital signal is unlikely to propagate noise to another wiring. A wire W3 connects the SoC 55, the preamplifier 71, and the MA driver 72 to transmit a serial signal, and has a low impedance. A wire W4 connecting the amplifier power supply 92 and the MA driver 72 also has a low impedance. Because of this, the wires W3 and W4 can avoid noise propagation from the wires W1 and W2. The wire W3 serves as an electric path including the second driver wire 112 and a wire on the PCB 19 connected to the second driver wire 112.

A wire W5 connects the MA driver 72 and the first MAs 47 or the second MAs 48 and has a high impedance. The wire W5 serves as an electric path including the first driver wire 111 and a wire of the flexure 43 connected to the first driver wire 111. However, the first driver wire 111 is not adjacent to the power supply wire 113 and the VCM wires 114 as described above. Thus, the first driver wire 111 (wire W5) can avoid noise propagation from the power supply wire 113 (wire W1) and the VCM wires 114 (wire W2). In addition, the wire W5 is shortened in length, therefore, it can be less affected by noise due to other factors.

Owing to the prevention of noise propagation as described above, for example, the wire connecting the SoC 55, the read element 14a, and the write element 14b is prevented from noise propagation. If noise enters into a read signal, the noise may be amplified by the preamplifier 71, making it difficult for the HDD 10 to read information or perform a positioning control by a servo signal. If noise enters into a write signal, the noise may cause difficulty for the HDD 10 to accurately write information. In this regard, the HDD 10 of the present embodiment can prevent the noise propagation between the wires as described above, to be able to prevent noise hindrance to the reading and writing of information and the positioning control.

A drive signal transmitted through the first driver wire 111 has a high voltage. To ensure a withstand voltage, in general, high-voltage wiring is designed to be apart from other wiring. In the present embodiment, however, due to a shorter length of the first driver wire 111, it is possible to facilitate the layout design of the wires 69 including the first driver wire 111 on the FPC 18.

In the HDD 10 according to the first embodiment described above, the MA drivers 72 are mounted apart from the preamplifier 71 on the FPC 18. Each of the MA drivers 72 outputs a drive signal for driving the first MA 47 (second MA 48) to the first MA 47 (second MA 48). The drive signal that drives the first MAs 47 (second MAs 48), such as a piezo element, is generally high in voltage and low in current. Thus, the wire W5 between the MA driver 72 and the first MA 47 (second MA 48) has a high impedance and is likely to propagate noise to other wires. In the present embodiment, however, the MA driver 72 is mounted on the FPC 18, thus, the wire W5 between the MA driver 72 and the first MA 47 (second MA 48) is shortened in length than the one for the MA driver 72 mounted on the PCB 19. Thereby, noise propagation between the wire W5 between the MA driver 72 and the first MA 47 (second MA 48) and other wires can be prevented. For example, it is possible to prevent noise propagation from the wire W5 between the MA driver 72 and the first MA 47 (second MA 48) to the wire between the magnetic head 14 and the preamplifier 71 or the wire between the control circuit 56 and the preamplifier 71. That is, no noise enters into the information read and written by the magnetic head 14. Further, the MA driver 72 is mounted apart from the preamplifier 71 on the FPC 18. In other words, the MA driver 72 and the preamplifier 71 are different components. This makes it possible for the HDDs 10 of different types including different numbers of first MAs 47 (second MAs 48) to incorporate a number of MA drivers 72 in accordance with the number of the first MAs 47 (second MAs 48). Thus, the designs of the MA drivers 72 can be the same.

In addition, in the case of mounting the MA drivers 72 on the PCB 19, the number of wires connecting the MA drivers 72 and the actuators (first MAs 47 and second MAs 48) may increase along with an increase in the number or functions of the actuators, for example. For example, the HDD 10 adopts a TSA system, performs offset control of the actuators, or controls the actuators for self-servo write (SSW), which results in increasing the number of the wires. As the number of wires increases, for example, the number of the pins 68 of the connector 66 of the second connection 62 increases, enlarging the connector 66 in size. In the present embodiment, however, the MA drivers 72 are connected to the FPC 18. It is easier to reduce wiring for control signals for controlling the MA drivers 72 than to reduce wiring for drive signals output from the MA drivers 72. This can prevent an increase in the number of the pins 68 of the connector 66, downsizing the connector 66.

The MA drivers 72 are mounted apart from the preamplifier 71 on the FPC 18. The first driver wire 111 is installed on the FPC 18 to connect the first connection 61 and the MA drivers 72. The second driver wire 112 is installed on the FPC 18 to connect the second connection 62 and the MA drivers 72, and has a lower impedance than the first driver wire 111. That is, the first driver wire 111 has a higher impedance and is thus likely to propagate noise to other wires. In the present embodiment, however, the MA drivers 72 are mounted on the FPC 18, enabling a decrease in the length of the first driver wire 111 connected to the MA drivers 72 and having a high impedance as compared with that connected to the MA drivers 72 mounted on the PCB 19. This leads to preventing the noise propagation between the first driver wire 111 connected to the MA drivers 72 and other wires.

The MA drivers 72 are located closer to the first connection 61 than to the second connection 62. This arrangement can shorten the length of the wire W5 between the MA drivers 72 and the first MAs 47 (second MAs 48). Thus, the wire W5 between the MA drivers 72 and the first MAs 47 (second MAs 48) is prevented from propagating noise to other wires.

The FPC 18 includes the first driver terminals 101 connected to the MA drivers 72, the first driver wire 111 which connects the first driver terminals 101 and the first connection 61, the preamplifier terminal 103 connected to the preamplifier 71, and the power supply wire 113 which connects the preamplifier terminal 103 and the second connection 62 for supplying power to the preamplifier 71. The first driver terminals 101 are located closer to the first connection 61 than the preamplifier terminal 103. Thus, the first driver wire 111 and the power supply wire 113 are not adjacent to each other in a direction (horizontal direction) orthogonal to a direction in which these wires extend. Thus, noise propagation between the first driver wire 111 and the power supply wire 113 is prevented. The first driver wire 111 transmits the drive signal and thus has a high impedance as described above. Moreover, for example, the power generated by the switching power supply is supplied to the preamplifier 71 through the power supply wire 113, therefore, noise may flow through the power supply wire 113. The HDD 10 of the present embodiment, however, can prevent the noise propagation from the power supply wire 113 to the first driver wire 111. That is, it is possible to prevent noise propagation from the first driver wire 111 to the wire between the magnetic head 14 and the preamplifier 71 or the wire between the control circuit 56 and the preamplifier 71, so that no noise enters into the information read and written by the magnetic head 14.

The FPC 18 includes the third connection 63 connected to the VCM 16 and the VCM wires 114 connecting the second connection 62 and the third connection 63. The first driver terminals 101 are located closer to the first connection 61 than to the third connection 63. Thus, the first driver wire 111 and the VCM wires 114 are not adjacent to each other in a direction (horizontal direction) orthogonal to a direction in which these wires extend. This arrangement can prevent noise propagation between the first driver wire 111 and the VCM wires 114.

The SoC 55 of the control circuit 56 outputs the digital signal including the first address AD1 or the second address AD2. The preamplifier 71 operates by the digital signal including the first address AD1. Each MA driver 72 includes the DACs 87 that convert the digital signal including the second address AD2 into the analog drive signal. The MA driver 72 includes the MA amplifiers 88 that amplify the drive signal and outputs the amplified drive signal to the first MAs 47 (second MAs 48). That is, the preamplifier 71 and the MA driver 72 operate by the common digital signal. That is, according to the HDD 10 of the present embodiment, it is possible to decrease the number of the pins 68 included in the second connection 62 as compared with the preamplifier 71 and the MA driver 72 operating by individual digital signals output from the control circuit 56. In addition, the preamplifier 71 and the MA driver 72 operate according to the first address AD1 or the second address AD2 so that they are less likely to malfunction due to communication interference.

Second Embodiment

Hereinafter, a second embodiment will be described with reference to FIG. 6. Note that a constituent element having the same function as a constituent element that has been already described will be denoted by the same reference sign as that of the above-described constituent element, and the additional description will be omitted in some cases in the following description of a plurality of embodiments. In addition, a plurality of constituent elements denoted by the same reference sign does not necessarily have all the functions and properties in common, and may have different functions and properties according to each embodiment.

Figure 6:
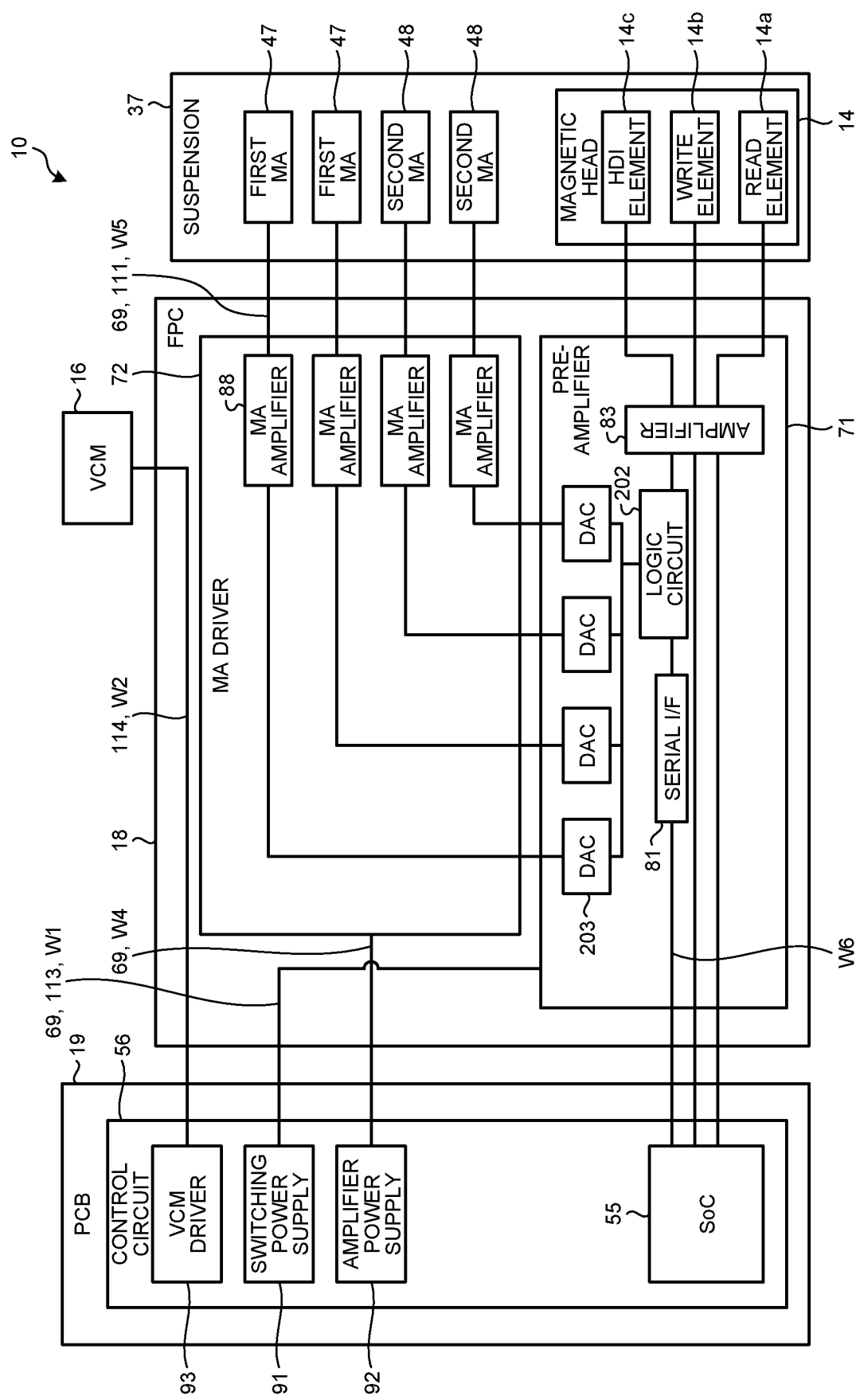
FIG. 6 is an exemplary block diagram schematically illustrating functions of a hard disk drive according to a second embodiment.

FIG. 6 is an exemplary block diagram schematically illustrating functions of a HDD 10 according to the second embodiment. As illustrated in FIG. 6, a preamplifier 71 of the second embodiment includes a logic circuit 202 and a plurality of digital-to-analog converters (DACs) 203 instead of the logic circuit 82. The preamplifier 71 may include other components and circuitry.

Each MA driver 72 of the second embodiment includes a plurality of MA amplifiers 88 corresponding to the plurality of DACs 203 in place of the serial I/F 85, the logic circuit 86, and the DACs 87. The MA driver 72 may include other components and circuitry.

In the second embodiment, a wire W6 connects the SoC 55 and the serial I/F 81 of the preamplifier 71 instead of the wire W3. The wire W6 serves as an electric path including the wires 69 on the FPC 18 and wires on the PCB 19 connected to the wires 69.

The SoC 55 outputs a serial signal to the serial I/F 81 of the preamplifier 71 through the wire W6. The preamplifier 71 outputs a control signal to the magnetic disk 12 or a drive signal to the MA driver 72 according to the address AD of the data signal SDATA.

For example, the logic circuit 202 of the preamplifier 71 operates by the data signal SDATA including the first address AD1. For example, the logic circuit 202 outputs various control signals to the magnetic head 14 through the amplifier 83 in accordance with the data signal SDATA including the first address AD1.

The logic circuit 202 outputs the data signal SDATA including the second address AD2 to one of the DACs 203 corresponding to the second address AD2. As a result, the DAC 203 converts a digital signal including the corresponding second address AD2 into an analog drive signal. The DAC 203 outputs the analog drive signal to a corresponding one of the MA amplifiers 88 of the MA driver 72. The MA amplifier 88 receives and amplifies the drive signal from the corresponding DAC 203 and outputs the amplified drive signal to the corresponding first MA 47 or second MA 48.

In the HDD 10 of the second embodiment described above, the preamplifier 71 includes the DACs 203. Thereby, the MA driver 72 can be downsized. In addition, the wire W6 includes no branch, enabling simplification of the wires 69 on the FPC 18.

Third Embodiment

Figure 7:
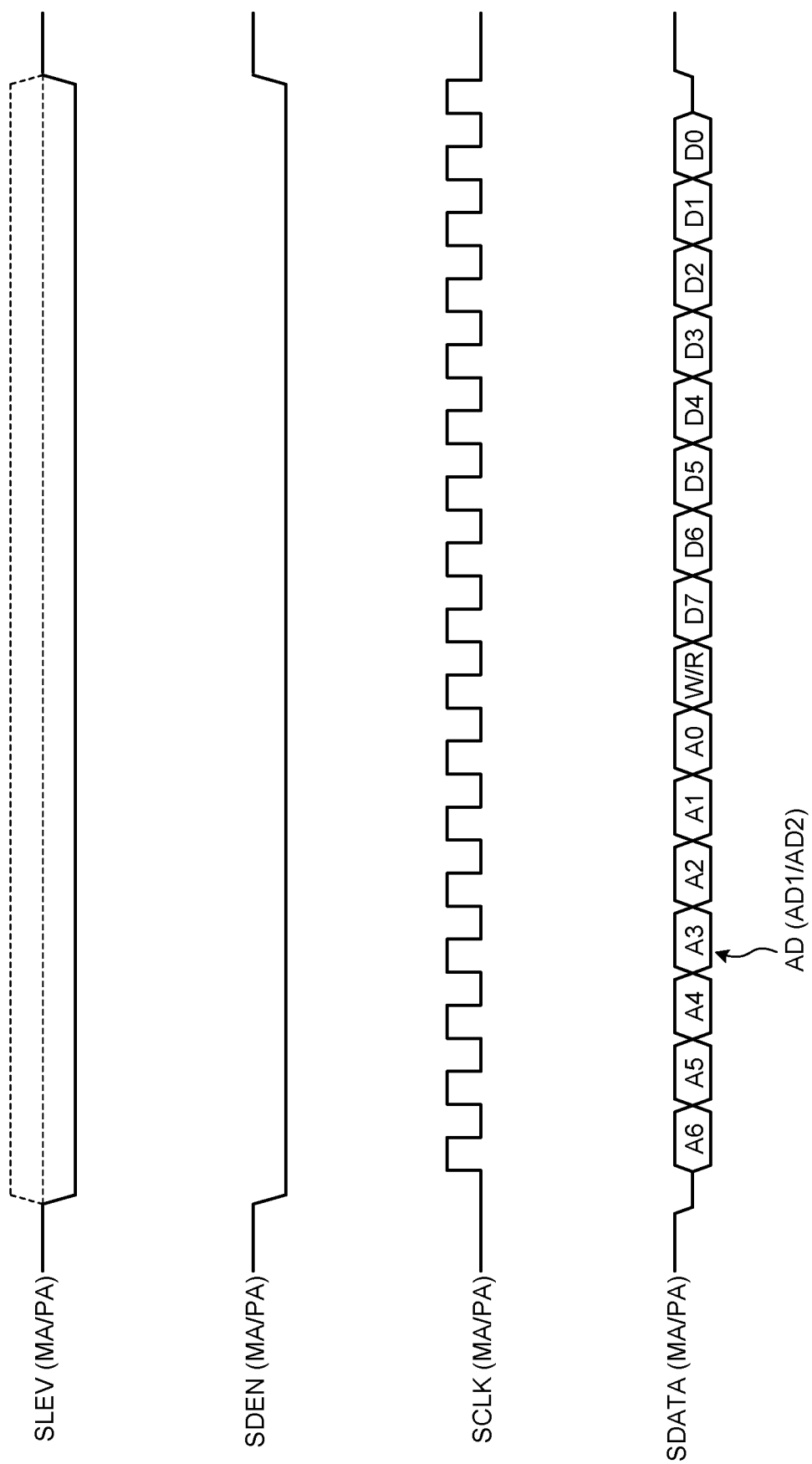
FIG. 7 is an exemplary timing chart illustrating an example of a serial signal output by a system-on-chip according to a third embodiment.

Hereinafter, a third embodiment will be described with reference to FIG. 7. FIG. 7 is an exemplary timing chart illustrating an example of a serial signal output by the SoC 55 according to the third embodiment.

The third embodiment is different from the first embodiment and the second embodiment in the serial signal. A HDD 10 in the third embodiment may be configured same as that in the first embodiment or that in the second embodiment. The following will describe an example of the HDD 10 with the same configuration as that of the first embodiment.

In the third embodiment, for example, the SoC 55, the serial I/F 81 of the preamplifier 71, and the serial I/F 85 of the MA driver 72 are connected to one another in parallel via four wires. As illustrated in FIG. 7, the SoC 55 outputs the enable signal SDEN, the clock signal SCLK, the data signal SDATA, and a discrimination signal SLEV to the serial I/F 81 of the preamplifier 71 and the serial I/F 85 of the MA driver 72.

The discrimination signal SLEV is a signal that is switchable among a plurality of voltage levels, such as High, Low, and Open. The discrimination signal SLEV may be switchable among two or four or more voltage levels or may be switchable among a plurality of current levels.

In the third embodiment, the second address AD2 of the data signal SDATA includes, for example, at least one of an address indicating one of the first MA pair 47, an address indicating the other of the first MA pair 47, an address indicating one of the second MA pair 48, and an address indicating the other of the second MA pair 48. The second address AD2 is not limited to this example.

In response to receipt of the data signal SDATA including the second address AD2, the logic circuit 86 of the MA driver 72 determines an address to use according to a voltage level of the discrimination signal SLEV. That is, the logic circuit 86 uses an address, included in the second address AD2, corresponding to the voltage level of the discrimination signal SLEV, and outputs a serial signal to one of the DACs 87 corresponding to the address.

The DAC 87 receives and converts the serial signal from the logic circuit 82 into an analog drive signal for driving the corresponding first MA 47 or second MA 48. The DAC 87 outputs the analog drive signal to the corresponding MA amplifier 88.

The MA amplifier 88 receives and amplifies the drive signal from the corresponding DAC 87 and outputs the amplified drive signal to the corresponding first MA 47 or second MA 48. That is, the MA amplifier 88 amplifies a drive signal and outputs the amplified drive signal to one of the first MA 47 and the second MA 48 according to the voltage level of the discrimination signal SLEV.

The following will describe an example of the HDD 10 with the same configuration as that of the second embodiment. In this case, the SoC 55 and the serial I/F 81 of the preamplifier 71 are connected in parallel via the above-described four wires.

In response to receipt of the data signal SDATA including the second address AD2, the logic circuit 202 of the preamplifier 71 determines an address to use according to a voltage level of the discrimination signal SLEV. That is, the logic circuit 202 uses an address, included in the second address AD2, corresponding to the voltage level of the discrimination signal SLEV, and outputs a serial signal to one of the DACs 203 corresponding to the address.

The DAC 203 receives and converts the serial signal from the logic circuit 202 into an analog drive signal for driving the corresponding first MA 47 or second MA 48. The DAC 203 outputs the analog drive signal to the corresponding MA amplifier 88 of the MA driver 72.

The MA amplifier 88 receives and amplifies the drive signal from the corresponding DAC 87 and outputs the amplified drive signal to the corresponding first MA 47 or second MA 48. That is, the MA amplifier 88 amplifies a drive signal and outputs the amplified drive signal to one of the first MA 47 and the second MA 48 according to the voltage level of the discrimination signal SLEV.

In the HDD 10 of the third embodiment described above, each MA amplifier 88 amplifies a drive signal and outputs the amplified drive signal to one of the first MAs 47 and the second MAs 48 according to the level of the discrimination signal SLEV. Thereby, the MA driver 72 can output a drive signal to a desired actuator among the plurality of actuators (first MA pair 47 and second MA pair 48) mounted on the suspension 37.

Fourth Embodiment

Figure 8:
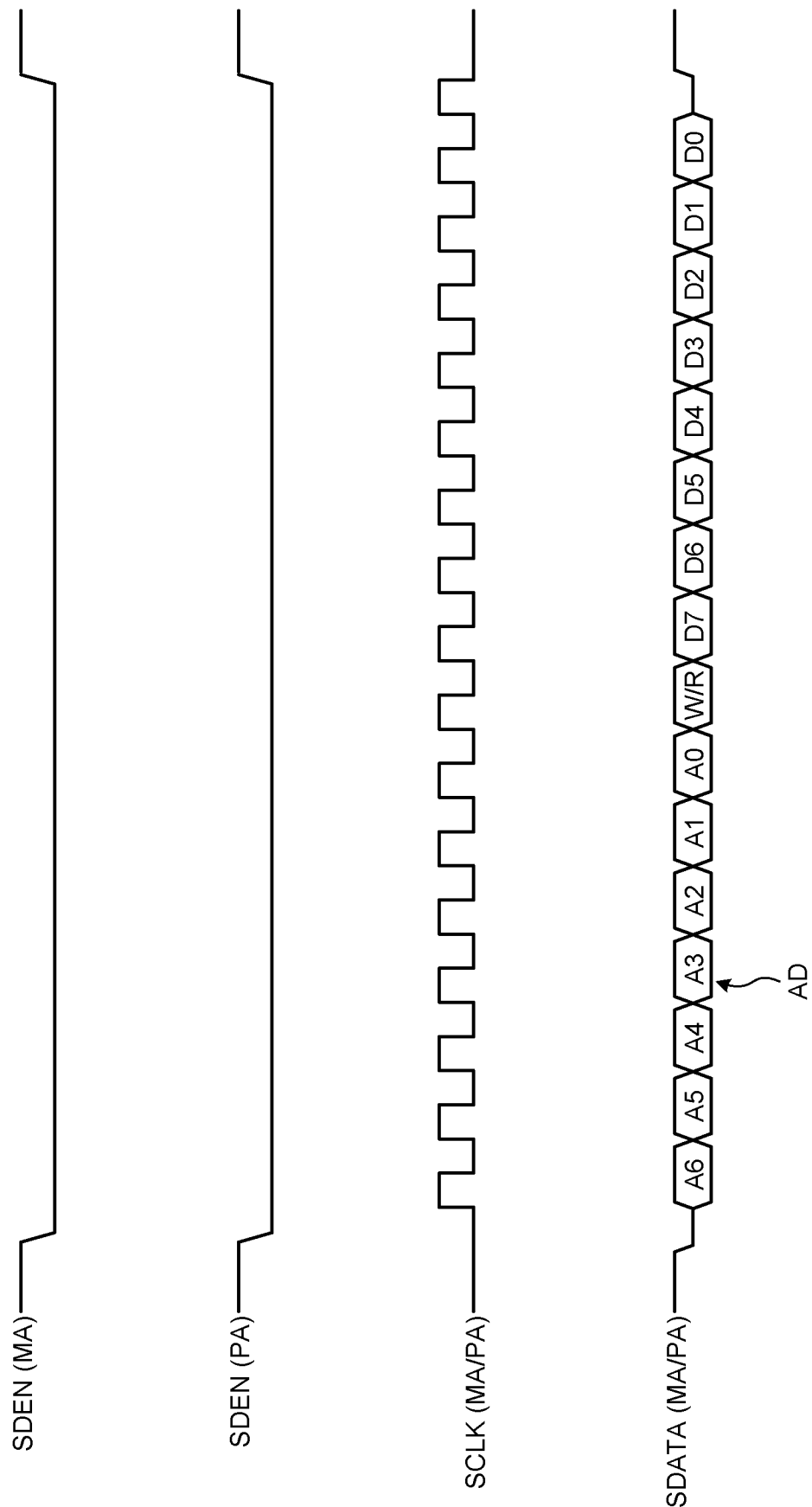
FIG. 8 is an exemplary timing chart illustrating an example of a serial signal output by a system-on-chip according to a fourth embodiment.

Hereinafter, a fourth embodiment will be described with reference to FIG. 8. FIG. 8 is an exemplary timing chart illustrating an example of a serial signal output by the SoC 55 according to the fourth embodiment.

The fourth embodiment is different from the first embodiment and the second embodiment in the serial signal. A HDD 10 in the fourth embodiment may be configured same as that in the first embodiment or that in the second embodiment. The following will describe an example of the HDD 10 having the same configuration as that of the first embodiment.

In the fourth embodiment, for example, the SoC 55, the serial I/F 81 of the preamplifier 71, and the serial I/F 85 of the MA driver 72 are connected in parallel via two wires that transmit the clock signal SCLK and the data signal SDATA.

The SoC 55 and the serial I/F 81 are connected via a wire that transmits a first enable signal SDEN (PA) for the preamplifier 71. Further, the SoC 55 and the serial I/F 85 are connected via a wire that transmits a second enable signal SDEN(MA) for the MA driver 72. That is, the SoC 55 of the control circuit 56 outputs digital signals including the first enable signal SDEN(PA) and the second enable signal SDEN(MA).

The first enable signal SDEN(PA) and the second enable signal SDEN(MA) are switchable between two voltage levels, that is, an active state and an inactive state. The voltage levels of the first enable signal SDEN(PA) and the second enable signal SDEN(MA) are switchable independently of each other. In the present embodiment, the SoC 55 sets the first enable signal SDEN(PA) and the second enable signal SDEN(MA) at mutually different voltage levels.

The logic circuit 82 of the preamplifier 71 operates by the data signal SDATA in response to the active state of the first enable signal SDEN(PA). When receiving the data signal SDATA in the active state of the first enable signal SDEN (PA), the logic circuit 82 outputs various control signals to the magnetic head 14 in accordance with the data signal SDATA. In response to the inactive state of the first enable signal SDEN(PA), however, the logic circuit 82 ignores the data signal SDATA.

The logic circuit 86 of the MA driver 72 ignores the data signal SDATA in response to the inactive state of the second enable signal SDEN(MA). The logic circuit 86 outputs the data signal SDATA to the DAC 87 in response to the active state of the second enable signal SDEN(MA). As a result, the DAC 87 converts the digital signal into an analog drive signal in the active state of the second enable signal SDEN (MA). The logic circuit 86 outputs the data signal SDATA to, for example, one of the DACs 87 according to the address AD of the data signal SDATA.

The DAC 87 outputs the analog drive signal to the corresponding MA amplifier 88. The MA amplifier 88 receives and amplifies the drive signal from the corresponding DAC 87 and outputs the amplified drive signal to the corresponding first MA 47 or second MA 48.

The following will describe an example of the HDD 10 with the same configuration as that in the second embodiment. In this case, the SoC 55 and the serial I/F 81 of the preamplifier 71 are connected together via four wires. The SoC 55 outputs the first enable signal SDEN(PA), the second enable signal SDEN(MA), the clock signal SCLK, and the data signal SDATA to the serial I/F 81 of the preamplifier 71.

The logic circuit 202 of the preamplifier 71 operates by the data signal SDATA in response to the active state of the first enable signal SDEN(PA). When receiving the data signal SDATA in the active state of the first enable signal SDEN(PA), the logic circuit 202 outputs various control signals to the magnetic head 14 in accordance with the data signal SDATA.

In response to the active state of the second enable signal SDEN(MA), the logic circuit 202 outputs the data signal SDATA to the DAC 203. As a result, the DAC 203 receives and converts the digital signal into an analog drive signal in the active state of the second enable signal SDEN(MA). The DAC 203 outputs the analog drive signal to the corresponding MA amplifier 88 of the MA driver 72. The MA amplifier 88 receives and amplifies the drive signal from the corresponding DAC 203 and outputs the amplified drive signal to the corresponding first MA 47 or second MA 48.

In the HDD 10 of the fourth embodiment described above, the control circuit 56 outputs digital signals including the first enable signal SDEN(PA) and the second enable signal SDEN(MA). The preamplifier 71 operates by the digital signal in response to the active state of the first enable signal SDEN(PA). The preamplifier 71 or the MA driver 72 includes the DACs 87 or 203 that convert the digital signal into the analog drive signal in the active state of the second enable signal SDEN(MA). The MA driver 72 includes the MA amplifiers 88 that amplify the drive signal and outputs the amplified drive signal to the first MAs 47 (second MAs 48). That is, the preamplifier 71 and the MA driver 72 operate by the common digital signal (data signal SDATA). Thus, according to the HDD 10 of the present embodiment, it is possible to decrease the number of the pins 68 included in the second connection 62 as compared with the preamplifier 71 and the MA driver 72 operating by individual digital signals (data signals SDATA) output from the control circuit 56. In addition, the preamplifier 71 and the MA driver 72 operate by the first enable signal SDEN(PA) and the second enable signal SDEN(MA) and are thereby prevented from malfunctioning due to communication interference.

Fifth Embodiment

Figure 9:
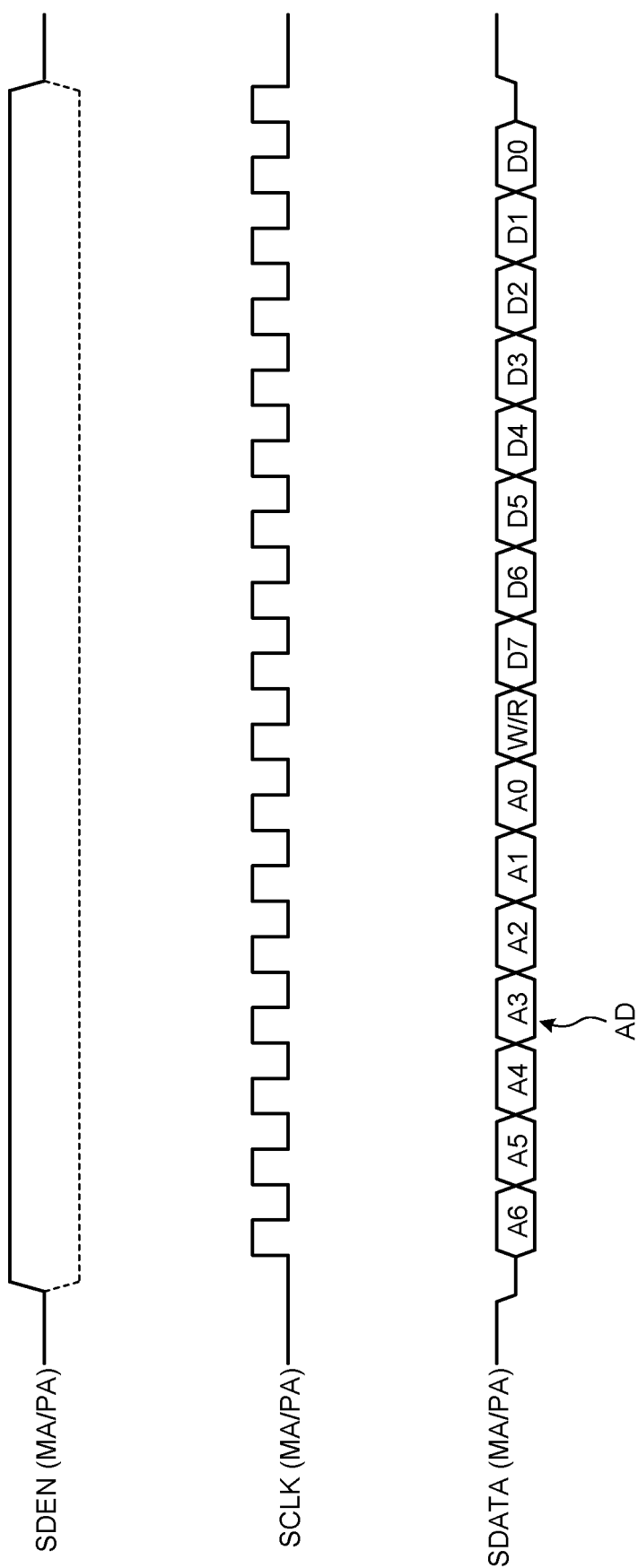
FIG. 9 is an exemplary timing chart illustrating an example of a serial signal output by a system-on-chip according to a fifth embodiment.

Hereinafter, a fifth embodiment will be described with reference to FIG. 9. FIG. 9 is an exemplary timing chart illustrating an example of a serial signal output by the SoC 55 according to the fifth embodiment.

The fifth embodiment is different from the first embodiment and the second embodiment in the operations of the logic circuits 82, 86, and 202. A HDD 10 in the fifth embodiment may be configured same as that in the first embodiment or that in the second embodiment. The following will describe an example of the HDD 10 with the same configuration as that of the first embodiment.

In the fifth embodiment, for example, the SoC 55, the serial I/F 81 of the preamplifier 71, and the serial I/F 85 of the MA driver 72 are connected in parallel via three wires. As illustrated in FIG. 9, the SoC 55 outputs the enable signal SDEN, the clock signal SCLK, and the data signal SDATA to the serial I/F 81 of the preamplifier 71 and the serial I/F 85 of the MA driver 72.

The enable signal SDEN is a signal that is switchable between two voltage levels, that is, an active state indicated by the solid line in FIG. 9 and an inactive state indicated by the broken line in FIG. 9. The active state is an example of a first state. The inactive state is an example of a second state. The active state may be an example of a second state, and the inactive state may be an example of a first state.

The logic circuit 82 of the preamplifier 71 operates by the data signal SDATA in response to the active state of the enable signal SDEN. When receiving the data signal SDATA during the active state of the enable signal SDEN, the logic circuit 82 outputs various control signals to the magnetic head 14. In response to the inactive state of the enable signal SDEN, however, the logic circuit 82 ignores the data signal SDATA.

The logic circuit 86 of the MA driver 72 ignores the data signal SDATA during the active state of the enable signal SDEN. In response to the inactive state of the enable signal SDEN, however, the logic circuit 86 outputs the data signal SDATA to the DAC 87. As a result, the DAC 87 converts the digital signal into an analog drive signal in the inactive state of the enable signal SDEN. The logic circuit 86 outputs the data signal SDATA to, for example, one of the DACs 87 according to the address AD of the data signal SDATA.

The DAC 87 output the analog drive signal to the corresponding MA amplifier 88. The MA amplifier 88 receives and amplifies the drive signal from the corresponding DAC 87 and outputs the amplified drive signal to the corresponding first MA 47 or second MA 48.

The following will describe an example of the HDD 10 with the same configuration as that of the second embodiment. In this case, the SoC 55 and the serial I/F 81 of the preamplifier 71 are connected via three wires. The SoC 55 outputs the enable signal SDEN, the clock signal SCLK, and the data signal SDATA to the serial I/F 81 of the preamplifier 71.

The logic circuit 202 of the preamplifier 71 operates by the data signal SDATA in the active state of the enable signal SDEN. When receiving the data signal SDATA during the active state of the enable signal SDEN, the logic circuit 202 outputs various control signals to the magnetic head 14 in accordance with the data signal SDATA.

In response to the inactive state of the enable signal SDEN, the logic circuit 202 outputs the data signal SDATA to the DAC 203. The logic circuit 86 outputs the data signal SDATA to, for example, one of the DACs 203 according to the address AD of the data signal SDATA. As a result, the DAC 203 converts the digital signal into an analog drive signal in the inactive state of the enable signal SDEN.

The DAC 203 outputs the analog drive signal to the corresponding MA amplifier 88 of the MA driver 72. The MA amplifier 88 receives and amplifies the drive signal from the corresponding DAC 203 and outputs the amplified drive signal to the corresponding first MA 47 or second MA 48.

In the HDD 10 of the fifth embodiment described above, the SoC 55 of the control circuit 56 outputs the digital signal including the enable signal SDEN. The preamplifier 71 operates by the digital signal in response to the active state of the enable signal SDEN. The preamplifier 71 or the MA driver 72 includes the DACs 87 or 203 that convert the digital signal into the analog drive signal in response to the inactive state of the enable signal SDEN. The MA driver 72 includes the MA amplifiers 88 that amplify the drive signal and output the amplified drive signal to the first MAs 47

(second MAs 48). That is, the preamplifier 71 and the MA driver 72 operate by the common digital signal. Thus, according to the HDD 10 of the present embodiment, it is possible to decrease the number of the pins 68 included in the second connection 62 as compared with the preamplifier 71 and the MA driver 72 operating by individual digital signals output from the control circuit 56. In addition, the preamplifier 71 and the MA driver 72 operate in accordance with the two different states of the enable signal SDEN, therefore, they can be prevented from malfunctioning due to communication interference.

Sixth Embodiment

Figure 10:
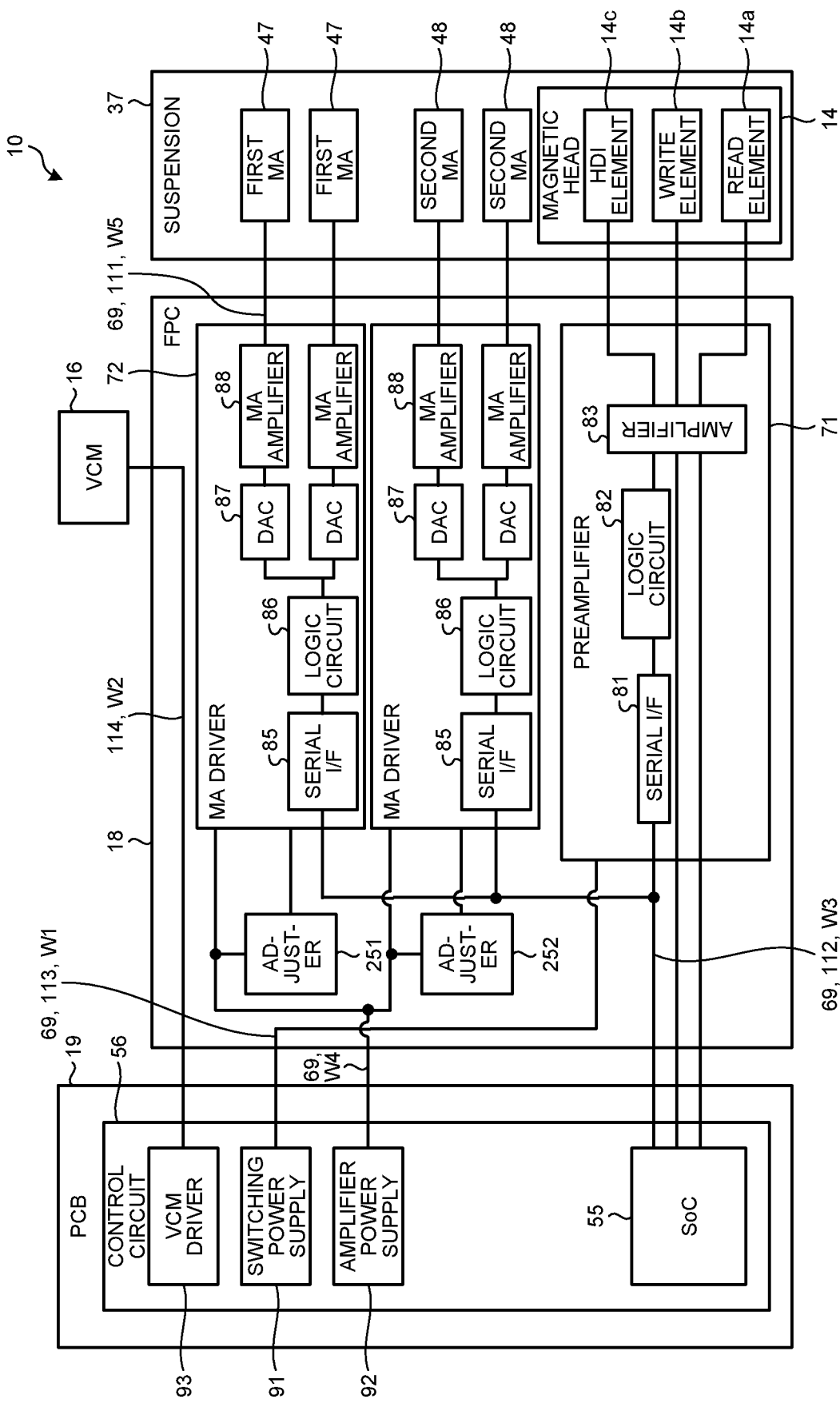
FIG. 10 is an exemplary block diagram schematically illustrating functions of a hard disk drive according to a sixth embodiment.

Hereinafter, a sixth embodiment will be described with reference to FIG. 10. FIG. 10 is an exemplary block diagram schematically illustrating functions of the HDD 10 according to the sixth embodiment. As illustrated in FIG. 10, the sixth embodiment is different from the first embodiment in that the FPC 18 is provided with a plurality of adjusters 251 and 252.

The number of the adjusters 251 and 252 is the same as the number of MA drivers 72. The number of the adjusters 251 and 252 is not limited to this example. The adjusters 251 and 252 are, for example, electrical resistors. Resistance values of the adjusters 251 and 252 are set differently from each other.

The wire W4 connects the amplifier power supply 92 and a plurality of MA drivers 72 in parallel. Further, the wire W4 in the present embodiment is branched to further connect the amplifier power supply 92 and the adjusters 251 and 252.

The adjuster 251 is connected to a given terminal (pin) of a corresponding one of the MA drivers 72. Thus, the adjuster 251 decreases a voltage supplied from the amplifier power supply 92 to a given voltage and applies the decreased voltage to the corresponding MA driver 72. For example, the adjuster 251 applies a voltage of 1 V to the corresponding MA driver 72. The MA driver 72 uses the voltage supplied from the adjuster 251 as a signal for discrimination (discrimination signal).

The adjuster 252 is connected to a given terminal (pin) of a corresponding one of the MA drivers 72. Thus, the adjuster 252 decreases a voltage supplied from the amplifier power supply 92 to a given voltage and applies the decreased voltage to the corresponding MA driver 72. For example, the adjuster 252 applies a voltage of 2 V to the corresponding MA driver 72. In this manner, the MA drivers 72 are applied with mutually different voltages. The MA drivers 72 use the voltage supplied from the adjuster 252 as a discrimination signal.

Each of the adjusters 251 and 252 constantly applies a given voltage to the corresponding MA driver 72. The voltages supplied from the adjusters 251 and 252 to the MA drivers 72 may be variable. In addition, the adjusters 251 and 252 may decrease a voltage of another power supply such as the switching power supply 91 to a given voltage in addition to or in place of the amplifier power supply 92.

In the sixth embodiment, the second address AD2 of the data signal SDATA includes, for example, an address corresponding to the MA driver 72 connected to the adjuster 251 and an address corresponding to the MA driver 72 connected to the adjuster 252. The second address AD2 is not limited to this example.

In response to receipt of the data signal SDATA including the second address AD2, the logic circuit 86 of each of the MA drivers 72 determines an address to use according to the voltage applied from the adjuster 251 or 252. That is, the logic circuit 86 of each of the MA drivers 72 uses the address, included in the second address AD2, corresponding to the voltage applied from the adjuster 251 or 252, and outputs a digital signal to the DAC 87 corresponding to the address.

The DAC 87 receives and converts the digital signal from the logic circuit 82 into an analog drive signal for driving the corresponding first MA 47 or second MA 48. The DAC 87 outputs the analog drive signal to the corresponding MA amplifier 88.

The MA amplifier 88 receives and amplifies the drive signal from the corresponding DAC 87 and outputs the amplified drive signal to the corresponding first MA 47 or second MA 48. As described above, each of the MA drivers 72 outputs the drive signal to the corresponding one of the first MAs 47 and the second MAs 48 according to one of the addresses of the second address AD2, the one corresponding to the voltage applied from the adjuster 251 or 252.

In the HDD 10 of the sixth embodiment described above, each of the MA drivers 72 outputs the drive signal to the corresponding one of the first MAs 47 and the second MAs 48 according to one of the addresses of the second address AD2, the one corresponding to the applied voltage. This enables a desired one of the MA drivers 72 to output a drive signal to a desired one of the actuators (first MA pair 47 and second MA pair 48) mounted on the suspension 37. This further enables the MA drivers 72 having the same circuit design to individually output the drive signals to desired actuators according to individually applied voltages. Thus, the circuit designs of the MA drivers 72 can be the same, resulting in cost reduction of the HDD 10.

Seventh Embodiment

Figure 11:
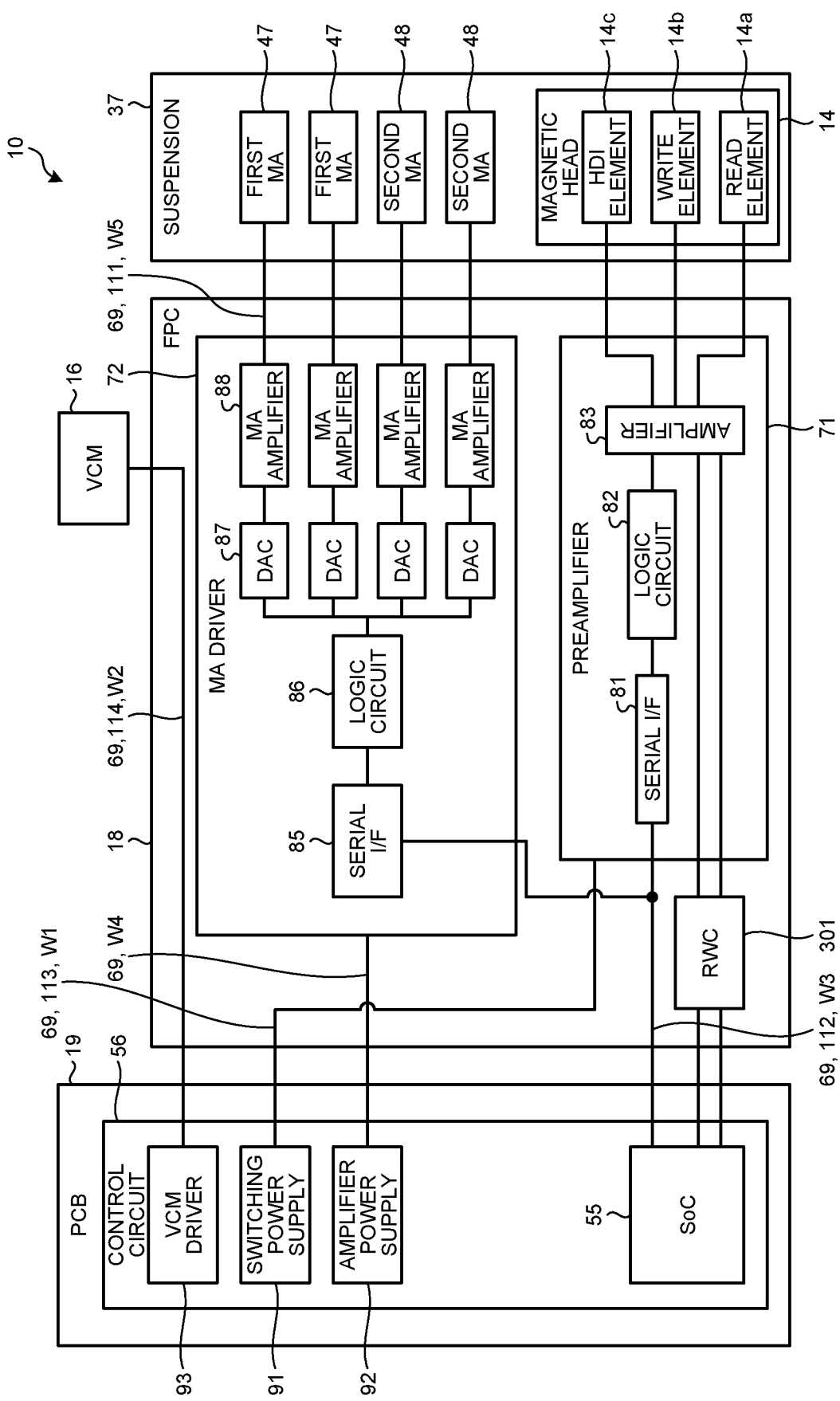
FIG. 11 is an exemplary block diagram schematically illustrating functions of a hard disk drive according to a seventh embodiment.

Hereinafter, a seventh embodiment will be described with reference to FIG. 11. FIG. 11 is an exemplary block diagram schematically illustrating functions of the HDD 10 according to the seventh embodiment. As illustrated in FIG. 11, the seventh embodiment is different from the first embodiment in that a read/write channel (RWC) 301 is mounted on the FPC 18.

In the first embodiment, the SoC 55 includes the RWC while in the seventh embodiment the RWC 301 and the SoC 55 are different components mounted on the FPC 18. The RWC 301 is electrically connected to the SoC 55 and the serial I/F 81 of the preamplifier 71.

The RWC 301 is a signal processing circuit, and encodes and converts write data transferred from the HDC of the SoC 55 into a write signal, and outputs the write signal to the serial I/F 81 of the preamplifier 71. In addition, the RWC 301 decodes and converts a read signal output from the magnetic head 14 into read data, and outputs the read data to the HDC. The SoC 55 and the RWC 301 communicate with each other via, for example, a high-speed interface using a differential signal.

As in the HDD 10 of the seventh embodiment described above, various components and circuits such as the RWC 301 may be mounted on the FPC 18 in place of on the PCB 19. The seventh embodiment has described the example that the RWC 301 is mounted on the FPC 18 in the HDD 10 of the first embodiment. Alternatively, the RWC 301 may be mounted on the FPC 18 in the HDD 10 of the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk device comprising:
a recording medium of a disk form;
a suspension;
a magnetic head mounted on the suspension and configured to read and write information from and to the recording medium;
an actuator mounted on the suspension, to move the magnetic head;
a housing in which the recording medium, the suspension, the magnetic head, and the actuator are disposed;
a circuit board located outside the housing, the circuit board comprising a control circuit that controls the magnetic head and the actuator;
a flexible printed circuit board disposed in the housing, the flexible printed circuit board comprising a first connection connected to the suspension and a second connection connected to the circuit board;
a preamplifier mounted on the flexible printed circuit board, and configured to output, to the magnetic head, a write signal corresponding to information to be written to the recording medium by the magnetic head, and receive, from the magnetic head, a read signal corresponding to information read from the recording medium by the magnetic head; and
an actuator driver mounted apart from the preamplifier on the flexible printed circuit board, and configured to output a drive signal for driving the actuator to the actuator.

2. The disk device of claim 1, wherein
the actuator driver is located closer to the first connection than to the second connection.

3. The disk device of claim 1, wherein
the flexible printed circuit board comprises:
a first terminal connected to the actuator driver;
a first wire that connects the first terminal and the first connection;
a second terminal connected to the preamplifier; and
a second wire that connects the second terminal and the second connection for supplying power to the preamplifier, and
the first terminal is located closer to the first connection than the second terminal.

4. The disk device of claim 3, further comprising:
an arm to which the suspension is attached; and
a voice coil motor that moves the arm, wherein
the flexible printed circuit board comprises a third connection connected to the voice coil motor, and a third wire that connects the second connection and the third connection, and
the first terminal is located closer to the first connection than to the third connection.

5. The disk device of claim 1, wherein
the control circuit outputs a digital signal including a first address or a second address,
the preamplifier operates by the digital signal including the first address, the preamplifier or the actuator driver comprises a digital-to-analog converter that converts the digital signal including the second address into an analog signal as the drive signal, and
the actuator driver includes an amplifier that amplifies and outputs the analog drive signal to the actuator.

6. The disk device of claim 5, wherein
the actuator includes a plurality of actuator elements,
the digital signal includes a discrimination signal that is switchable between a plurality of levels, and
the amplifier amplifies and outputs the drive signal to one of the plurality of actuator elements corresponding to a level of the discrimination signal.

7. The disk device of claim 1, wherein
the actuator includes a plurality of actuator elements,
the actuator driver includes a plurality of driver elements to which mutually different voltages are applied,
the control circuit outputs a digital signal including a first address or a second address,
the second address includes a plurality of addresses corresponding to the plurality of driver elements,
the preamplifier operates by the digital signal including the first address, and
the plurality of driver elements outputs the drive signal to the corresponding actuator elements in accordance with the plurality of addresses of the second address corresponding to the voltages, respectively.

8. The disk device of claim 1, wherein
the control circuit outputs a digital signal including a first enable signal and a second enable signal,
the preamplifier operates by the digital signal in response to an active state of the first enable signal,
the preamplifier or the actuator driver comprises a digital-to-analog converter that converts the digital signal into an analog signal as the drive signal in response to an active state of the second enable signal, and
the actuator driver comprises an amplifier that amplifies and outputs the analog drive signal to the actuator.

9. The disk device of claim 1, wherein
the control circuit outputs a digital signal including an enable signal,
the preamplifier operates by the digital signal in response to a first state of the enable signal,
the preamplifier or the actuator driver comprises a digital-to-analog converter that converts the digital signal into an analog signal as the drive signal in response to a second state of the enable signal, and
the actuator driver comprises an amplifier that amplifies and outputs the analog drive signal to the actuator.

10. A disk device comprising:
a recording medium of a disk form;
a suspension;
a magnetic head mounted on the suspension and configured to read and write information from and to the recording medium;
a circuit board comprising a control circuit that controls the magnetic head;
a flexible printed circuit board comprising a first connection connected to the suspension and a second connection connected to the circuit board;
a preamplifier mounted on the flexible printed circuit board, and configured to output, to the magnetic head, a write signal corresponding to information to be written to the recording medium by the magnetic head, and receive, from the magnetic head, a read signal corresponding to information read from the recording medium by the magnetic head;

an electronic component mounted apart from the preamplifier on the flexible printed circuit board;
a fourth wire installed on the flexible printed circuit board, to connect the first connection and the electronic component; and
a fifth wire installed on the flexible printed circuit board, to connect the second connection and the electronic component, the fifth wire having a lower impedance than the fourth wire.

* * * * *